(12) United States Patent  (10) Patent No.: US 7,459,188 B2
Pern et al.  (45) Date of Patent: Dec. 2, 2008

(54) METHOD AND APPARATUS FOR MAKING DIAMOND-LIKE CARBON FILMS

(75) Inventors: Fu-Jann Pern, Golden, CO (US); Kenell J. Touryan, Indian Hills, CO (US); Zhozef Retevos Panosyan, Yerevan (AM); Aleksey Alekseyevich Gippius, Moscow (RU)

(73) Assignee: Alliance for Sustainable Energy, LLC, Golden, CO (US)

( * ) Notice: Subject to any disclaimer, the term of this patent is extended or adjusted under 35 U.S.C. 154(b) by 523 days.

(21) Appl. No.: 11/002,611

(22) Filed: Dec. 2, 2004

(65) Prior Publication Data

US 2008/0268170 A1  Oct. 30, 2008

(51) Int. Cl.
*H05H 1/24* (2006.01)
*H05H 1/02* (2006.01)
(52) U.S. Cl. .................. 427/569; 427/906; 427/570
(58) Field of Classification Search .......... None
See application file for complete search history.

(56) References Cited

U.S. PATENT DOCUMENTS 4,486,286 A * 12/1984 Lewin et al. .......... 204/192.11
5,288,543 A * 2/1994 Ueda et al. .................. 428/216
5,458,754 A * 10/1995 Sathrum et al. ........ 204/192.38
5,662,877 A * 9/1997 Shibahara et al. ........... 423/446
6,265,068 B1 * 7/2001 David et al. .................. 428/403
6,372,303 B1 * 4/2002 Burger et al. ................ 427/569

FOREIGN PATENT DOCUMENTS

AM  N851 A2 H01 L31/02    6/2000
CN  N 1188160(C23C16/26)  7/1998

* cited by examiner

*Primary Examiner*—Timothy Meeks
*Assistant Examiner*—Kelly M Stouffer
(74) *Attorney, Agent, or Firm*—Paul J. White; Mark D. Trenner; John Stolpa (57) ABSTRACT

Ion-assisted plasma enhanced deposition of diamond-like carbon (DLC) films on the surface of photovoltaic solar cells is accomplished with a method and apparatus for controlling ion energy. The quality of DLC layers is fine-tuned by a properly biased system of special electrodes and by exact control of the feed gas mixture compositions. Uniform (with degree of non-uniformity of optical parameters less than 5%) large area (more than 110 $cm^2$) DLC films with optical parameters varied within the given range and with stability against harmful effects of the environment are achieved.

8 Claims, 7 Drawing Sheets

METHOD AND APPARATUS FOR MAKING DIAMOND-LIKE CARBON FILMS

CONTRACTUAL ORIGIN OF INVENTION

The United States Government has rights in this invention pursuant to Contract No. DEAC36-99GO10337 between the U.S. Department of Energy and the National Renewable Energy Laboratory, a Division of Midwest Research Institute.

FIELD OF THE INVENTION

The present invention relates to deposition of diamond-like carbon films, and more specifically to ion-assisted plasma-enhanced deposition of diamond-like carbon films for uses including protection of materials against exposure to harmful agents, for example, encapsulation of surface of films, such as photovoltaic solar cells for protection against chemical, mechanical, and radiation damage.

BACKGROUND OF THE INFORMATION

A method of this type is described in Armenian patent (AM N851, HO1L31/02). According to this patent the deposition of diamond-like carbon (DLC) film on the front surface of a silicon photovoltaic cell with p-n junction and two contacts is performed using plasma flow produced by an ion source comprising a cylindrical hollow cathode, anode and a magnet (solenoid). The method is simple and reliable. Its disadvantage is in a considerable degree of non-uniformity of density of plasma flow and ion energy which limits the area of uniformly of DLC encapsulated substrates by 20 cm².

A method is known of deposition of antireflecting and passivating diamond-like or composite diamond film on the surface of optoelectronic devices (solar cells or photodetectors) using high-frequency plasma (Patent CN N1188160, C23C16/26, G02B1/11, 1998).

The closest to the claimed invention is a method of coating of substrates with various films including DLC using the separation of the substrate voltage from the production of the plasma (Patent H5 N6372303, C23C016/26, 2002). The substrate, biased by a combination of a direct voltage and a pulsed voltage with a frequency of 0.1 kHz-10 MHz, is rotated about several axes of rotation in a vacuum chamber with various plasma sources. The method produces a multilayer structure that is wear-resistant and that reduces friction. Optical characteristics of the coating are not controlled. It is not possible to produce by this method of DLC coating on plain substrates of large area.

SUMMARY OF THE INVENTION

An object of the present invention is to provide a method scaled upwards, which facilitates deposition of uniform (with degree of non-uniformity of optical parameters less than 5%) DLC film on large area surface (e.g., more than 110 cm²) photovoltaic solar cells to produces a DLC film that has optical parameters varied within the given range and that possesses stability against harmful effects of the environment.

The object is achieved by the control of ion energy, plasma discharge current and spatial distribution of ion current density by an electric field produced by a system of annular electrodes, comprising diaphragm, neutralizer, and accelerating electrodes. The uniformity of plasma is monitored by measurement of ion current density at the surface of the substrate (photovoltaic solar cell).

According to the present invention, DLC films with refractive index in the range of 1.48-2.60 are obtained by varying ion energy in the range of 20-140 eV, plasma current density in the range of 0.2-0.8 mA·cm$^{-2}$, and hydrocarbon content in the feed gas mixture in the range of 2-40%. Rotation of the substrates about three axes is used to improve the uniformity of DLC films, which allows the substrate temperature not to exceed 80° C.

According to the present invention, DLC films can be manufactured in the form of monolayer or multilayer (with discrete changes of refractive index) structures, or in the form of a layer with the refractive index continuously varying along the depth of film thickness. Used as encapsulants for photovoltaic solar cells, they allow light transmission of at least 95% and reflectivity of 5% within the range of photosensitivity of silicon. These encapsulants possess stability against UV, proton, and electron irradiation, chemical stability against attacks by strong acids, thermal and weathering stability against high temperature and humidity, and mechanical stability against scratching and environmental elements.

DETAILED DESCRIPTION

Figure 1:
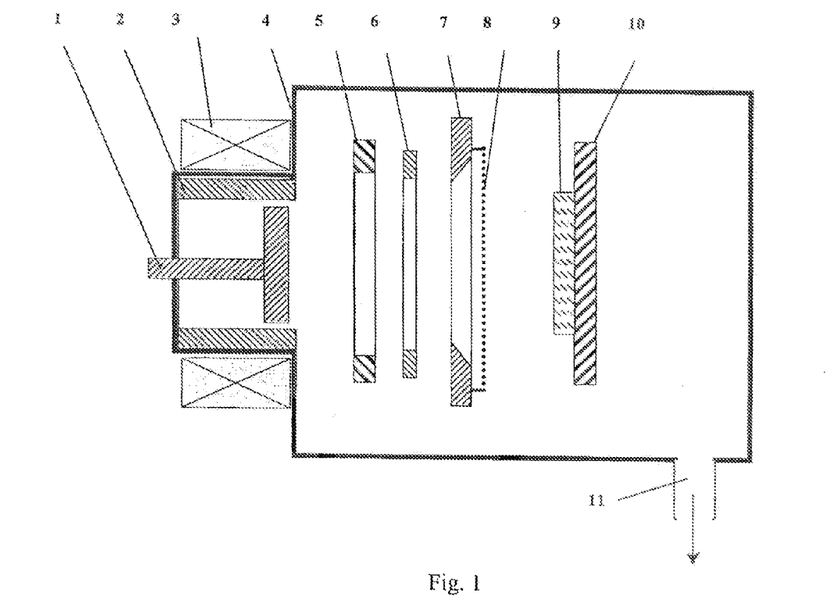
FIG. 1 shows a cross-sectional view of an ion source and a system of electrodes to control plasma.

FIG. 1 shows an apparatus that can be used for carrying out the method of depositing diamond-like carbon (DLC) films according to this invention. It includes a vacuum chamber 4, in which a radial direct current ion source is provided by an anode 1, a cylindrical cathode 2 and a magnet (solenoid) 3. A direct voltage potential in a range of 1-4 kV is applied between cathode 2 and anode 1. The magnet 3 forms magnetic field perpendicular to the electric field. Plasma 16 is formed in a gap between anode 1 and cathode 2 and is shaped in the form of a truncated cone as it projects into the chamber 4. Grounded diaphragm 5 slows down electrons and cuts off ions which move at angles more than 40° relative to the plasma axis to condition and collimate a flow of the ions toward the substrate 9. A neutralizer electrode 6, is placed outside the magnetic field. An alternating (AC) voltage in a range of 30-50 V is applied to the neutralizer electrode 6 in order to create the alternating current (AC) for providing the electron flow due to a thermo emission phenomenon. Since the anode voltage is about +2.5 kV, the potential of the neutralizer is negative relative to the anode. Therefore, the flow of emitted electrons in the plasma region is provided to neutralize slow ions and non-dissociated radicals ($C_xH_y$). As a consequence the ion flow reaching an accelerating electrode 7 possesses a low degree of non-uniformity of energies, i.e., fairly uniform ion energy. The accelerating electrode 7 provided with a grid 8 enables one to control or correct the energy of ions reaching the surface of a substrate (photovoltaic cell) 9 mounted on a support device 10. A voltage supply (not shown) biases accelerating electrode 7 and the support device 10 in a voltage range of −50 to −400 V, which provides average ion energy within the range 20 to 150 eV.

Figure 2:
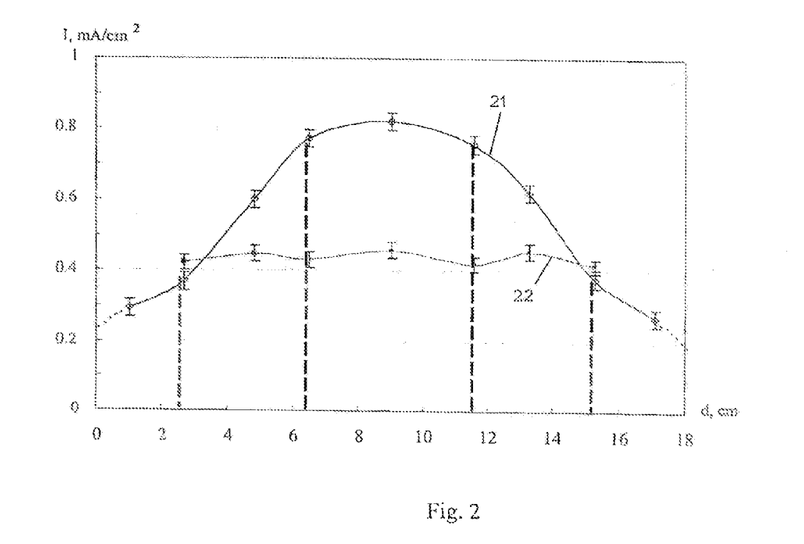
FIG. 2 shows spatial distribution of ion current density without (curve 1) and with (curve 2) a system of electrodes.

Initial (that is without the use of the electrodes 5, 6, 7) spatial distribution of ion current density I is approximated by the Boltzman function (FIG. 2, curve 21) with a 10% degree of non-uniformity only within a limited area of about 20 cm². Introduction of the electrodes 5, 6 and 7 produces much better plasma uniformity. Plasma is now shaped in the form of a cylinder, so that a 10% degree of non-uniformity of ion current density is measured within a diameter of about 12.6 cm (FIG. 2, curve 22). The degree of non-uniformity of energy of ions $C^+$, $H^+$, $N^+$ and $Ar^+$ does not exceed 10%. The apparatus and method of this invention can also be scaled up to larger deposition areas than the 12-13 cm diameter of this example and still achieve this uniformity in ion energy over such layer. Proportion of concentration of these ions is controlled by feed gas mixture composition ($C_7H_8$, Ar, $N_2$) brought into chamber 4 via a gas inlet conduit through the anode 1. The effluent gases leave through an exhaust system 11.

Figure 3:
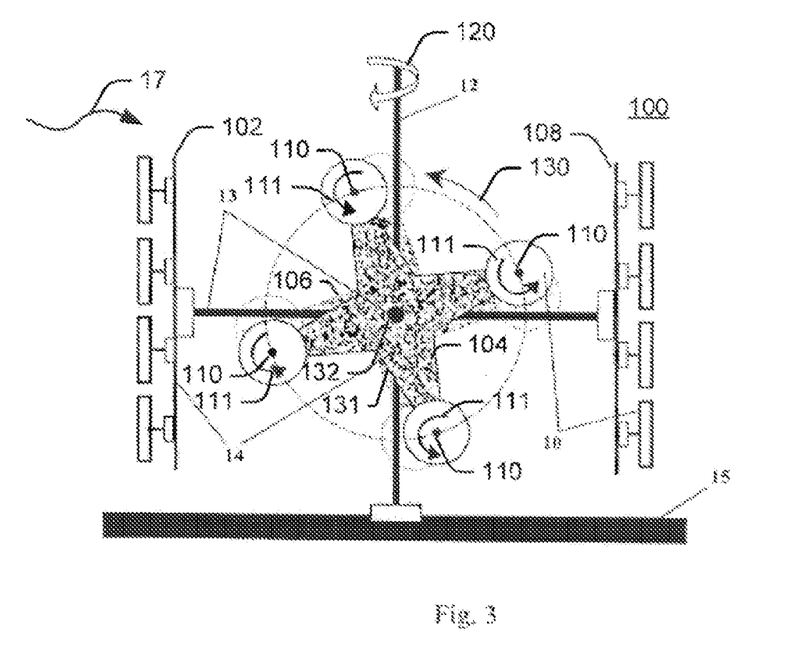
FIG. 3 shows a side view of a device for rotation of substrates.
Figure 4:
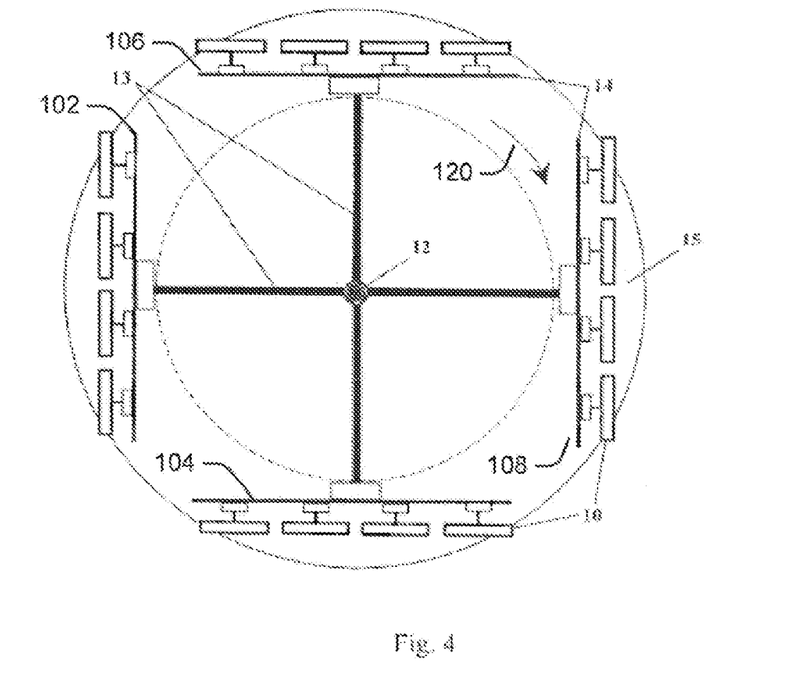
FIG. 4 shows a top view of the device shown in FIG. 3.
Figure 5:
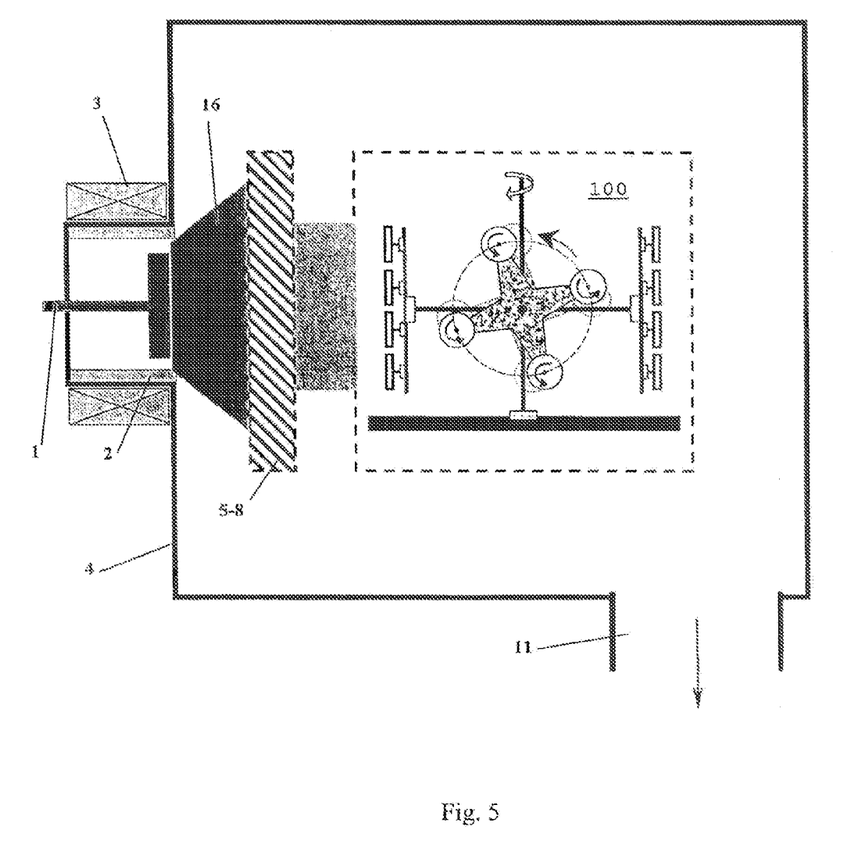
FIG. 5 shows a side view of the device shown in FIG. 3 in combination with the system of electrodes shown in FIG. 1.

In a preferred deposition apparatus embodiment 100 illustrated in FIGS. 3-5, a plurality of support devices 10 are configured and motivated to move a plurality of substrates 9 (see FIG. 1; not shown in FIGS. 3-5) sequentially into and out of alignment with the ion flow 17. In the apparatus 100, the individual support devices 10 and substrates 9 are also rotated to expose the substrates 9 to different portions of the ion flow 17 to attain uniform deposition of material on the substrates 9.

As illustrated in FIGS. 3-5, the support devices 10 of the apparatus 100 are ganged or grouped into a plurality of gangs 102, 104, 106, 108. Each gang 102, 104, 106, 108 has at least one support device 10 (four support devices 10 in the example of FIGS. 3-5). The support devices 10 are motivated to rotate about their respective axes 110, as indicated by arrows 111 in FIG. 3. The gangs 102, 104, 106, 108 are mounted on respective struts 13, which extend radially outward from a main shaft 12. The main shaft 12 rotates, as indicated by arrow 120, to move the respective gangs 102, 104, 106, 108 into and out of alignment with the ion flow 17 so that the substrates 9 in the respective gangs 102, 104, 106, 108 are exposed to the ion flow 17. This rotation of the gangs about the axis of shaft 12 into and out of alignment with the ion flow 17 not only enables the individual substrates 9 to get exposed to more portions of the ion flow 17 and thereby avoid uneven deposition, but also so that they are exposed to the ion flow 17 for limited times and then rotated out of such alignment for a time to avoid unnecessary heat build-up and temperature rise in the substrate 9. As the substrates 9 on one gang rotate out alignment with the ion flow 17, they can cool while other substrates 9 are rotated into alignment to receive the ion flow 17 and the resulting deposition. At the same time, the support devices 10 rotate the substrates 9 about their respective axes 110, as indicated by arrows 111, to also help achieve uniform deposition on the substrates 9.

To further enhance uniform deposition, each gang 102, 104, 106, 108 can be rotated about the axis of its respective strut 13, as indicated by arrow 130 in FIGS. 3 and 5. For example, as shown in FIGS. 3-5, the four support devices 10 on each gang 102, 104, 106, 108 are mounted on the distal ends of four arms 131 extending radially outward from a hub 132 of a wheel 14. The hub 132 is rotatable with respect to the axis of the strut 13 on which it is mounted so that the wheel 14 rotates the support devices 10 and substrates 9 about the respective axes of struts 13, as indicated by arrow 130.

While no particular orientation is essential, the shaft 12 is vertical in the example of FIGS. 3-5, so the axis of struts 13 and mountings 110 are horizontal. Therefore, in this example, rotation about a main vertical axis 12 is combined with rotation of four wheels 14 about the four horizontal axes of struts 13. Support devices 10 mounted on the wheels 14 rotate about their respective horizontal axes 110. As a consequence, substrates 9 perform complex movement about the base 15. Rotation in the range 10-30 rpm provides optimal trajectory which drives the substrates to traverse all the zones or areas across the plasma flow 17 and spend some time outside it, which facilitates their cooling. The complex movement of substrates 9 provides for better uniformity of the DLC coating (with less than 5% variation in mechanical and optical parameters—sometimes called "spread"—within an area of ~110 cm²) and relatively low (30-80° C.) temperature of deposition. The circular area of about 125 cm² (diameter of about 12.6 cm) in the example of the FIG. 2 analysis exceeds the area of the silicon plate and correspondingly provides the uniformity or homogeneity of the deposited coating. As mentioned above, the method and apparatus of this invention can be scaled up to larger deposition areas than the examples described herein and still achieve this uniformity in mechanical and optical parameters for such larger deposition areas. Therefore, this invention is not limited to the example areas of the examples provided herein.

Figure 6:
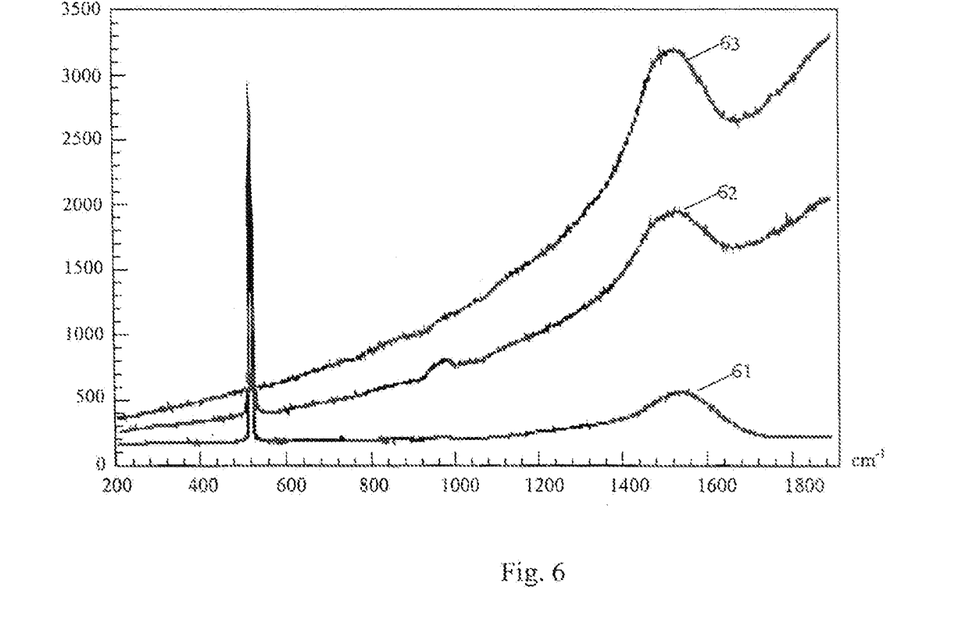
FIG. 6 shows a Raman spectra of three DLC films.

A film manufactured according to the present invention is high quality diamond-like material. FIG. 6 shows a Raman spectra of the DLC films of various thickness (240, 540, and 840 nm, for curves 61, 62 and 63 respectively) deposited under various technological conditions. The position of maximum of the curves indicate predominance of $sp^3$ bonds in these films.

Figure 7:
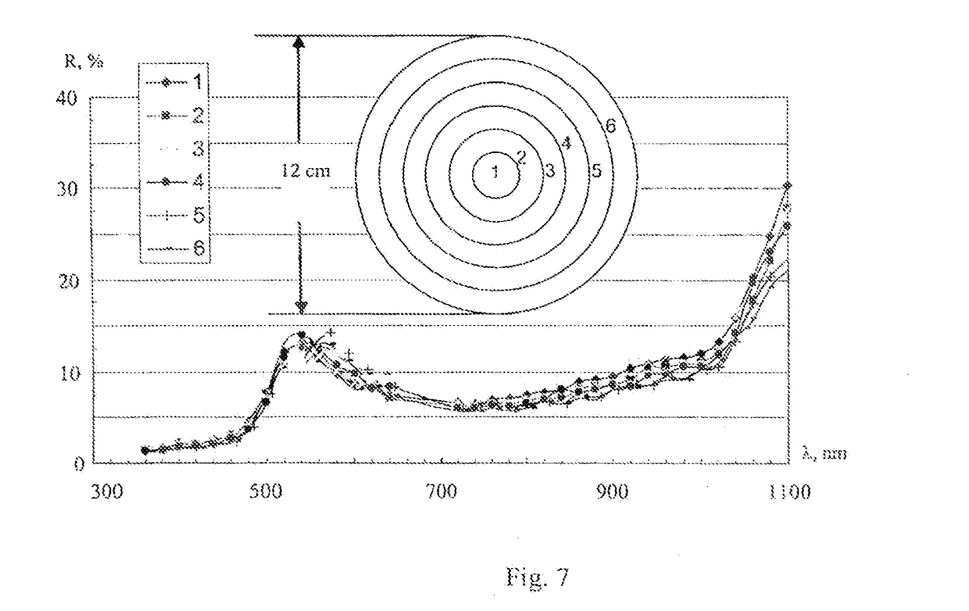
FIG. 7 shows reflection spectra from indicated spots of a DLC film deposited on a Si substrate.

Improved film uniformity obtained according to the present invention is illustrated in FIG. 7, which shows the nearly identical reflectance spectra for the different areas (as indicated) of a 12-cm diameter DLC film.

Properties of DLC films, in particular their optical parameters can be tuned by exact control of plasma parameters (ion beam current and energy; feed gas mixture composition). Table 1 shows parameters of 60-900 nm thick DLC films manufactured under various technological conditions where $U_{ac}$ is anode 1 to cathode 2 voltage, $I_{ac}$ is plasma discharge current in the ion source, $U_b$ is the bias applied to the diaphragm 7 and the support device 10, $<E_k>$ is the average kinetic energy of ions reaching the surface of the substrate (photovoltaic cell) 9, $I_p$ is the plasma current density at the surface of the substrate 9, n is the refractive index of a DLC film, H V is its microhardness. The feed gas mixture ($C_7H_8$, Ar, $N_2$) was 55% Ar, with 45% left for $C_7H_8$ and $N_2$. This method and apparatus also works with other carrier gases besides $N_2$ and Ar, as will be understood by persons skilled in the art. In Table 1, the percentage of $C_7H_8$ is given.

TABLE 1

| $C_7H_8$/% | $U_{ac}$, KV | $I_{ac}$/mA | $U_b$/V | $<E_k>$/eV | $I_p$/mA/cm$^2$ | n | HV kg/mm$^2$ |
|---|---|---|---|---|---|---|---|
| 35 | 2.5 | 30  | −300 | 90  | 0.20 | 1.48 | 2500 |
| 28 | 2.6 | 35  | −350 | 100 | 0.25 | 2.00 | 2750 |
| 24 | 2.8 | 40  | −400 | 140 | 0.30 | 2.10 | 2700 |
| 18 | 2.2 | 80  | −250 | 60  | 0.60 | 2.40 | 3000 |
| 12 | 2.3 | 100 | −300 | 65  | 0.65 | 2.45 | 2950 |
| 15 | 2.4 | 120 | −350 | 80  | 0.80 | 2.35 | 3100 |
| 10 | 1.5 | 45  | −20  | 20  | 0.35 | 2.55 | 2900 |
| 8  | 1.8 | 50  | −50  | 25  | 0.40 | 2.60 | 2850 |
| 4  | 2.0 | 60  | −100 | 50  | 0.45 | 2.57 | 2800 |

It is seen that with proper choice of deposition condition, the DLC films are manufactured with various microhardness (2500-3100 kg·mm$^{-2}$) and refractive indexes (1.48-2.60). The films show a density varying in the range of 1.8-2.35 g·cm$^{-3}$ and are characterized by small amount of microdefects, low internal stresses, good adhesion and reduced friction. These properties grant high mechanical stability of the DLC encapsulants.

DLC films with low refractive indexes are manufactured at the ratio $C_7H_8$:$N_2$=40:5 and at the average ion energy less than 140 eV. A feed gas mixture with higher ratio $C_7H_8$:$N_2$ produces DLC films with unacceptable high optical absorption. Ions with energies higher than 140 eV cause degradation of the properties of photovoltaic cells. Films manufactured at ion energies of less than 20 eV possess too high refractive index to be useful for antireflective coating. Plasma current less than 0.20 mA·cm$^{-2}$ does not grant proper efficiency of the DLC deposition. Plasma current more than 0.80 mA·cm$^{-2}$ causes an increase an amount of defects in the films.

Figure 8:
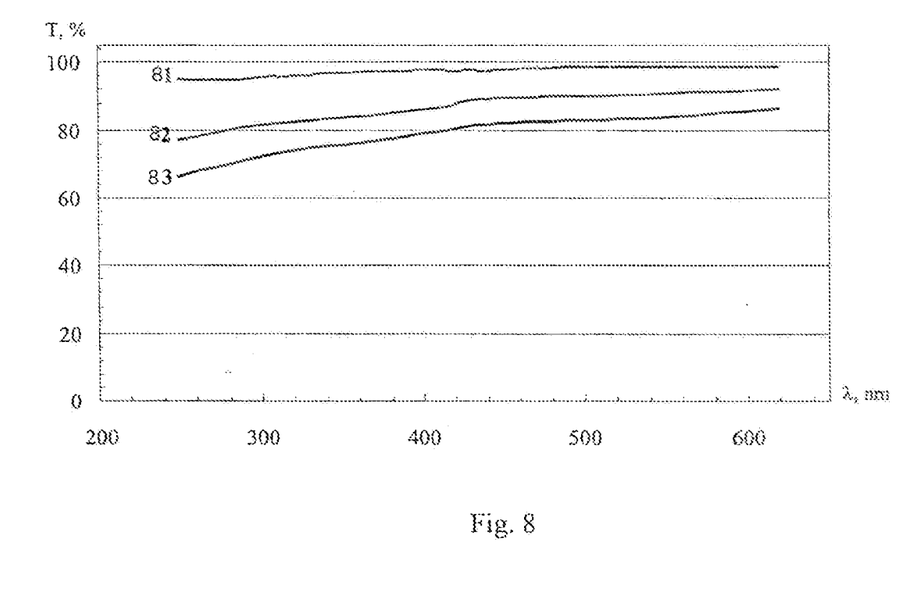
FIG. 8 shows transmission spectra of three DLC films deposited on sapphire substrates under various conditions.

Optical transmission of DLC coating and, consequently, efficiency improvement of photovoltaic solar cells can be tuned by exact control of deposition conditions. FIG. 8 shows the transmittance spectra of two DLC film samples of the same thickness (curves 81 and 82), but deposited on sapphire substrates under different conditions. Transmittance is determined as T=I/I$_0$(1−R), where I$_0$ and I are the incident and transmitted light intensities, respectively, and R is the reflectance of a film. It is seen that the transmission of the two films differ by 17% at λ=260 nm. In the range of 300-620 nm, transmittance of one of the 185 nm thick film is ~98% with a band gap of ~4 eV; this grants very low absorption losses which is a prerequisite of effective use of such films as encapsulants for photovoltaic solar cells. Curve 83 of FIG. 8 corresponds to a 240 nm film sample deposited under technological conditions different from those for the other two samples.

Based upon the relationship between the technological parameters and value of refractive index, it is possible to manufacture DLC films with the preset variation of refractive index within the DLC layer that is either multilayer structures or a monolayer with continuous variation of refractive index through the depth of the DLC film thickness.

Figure 9:
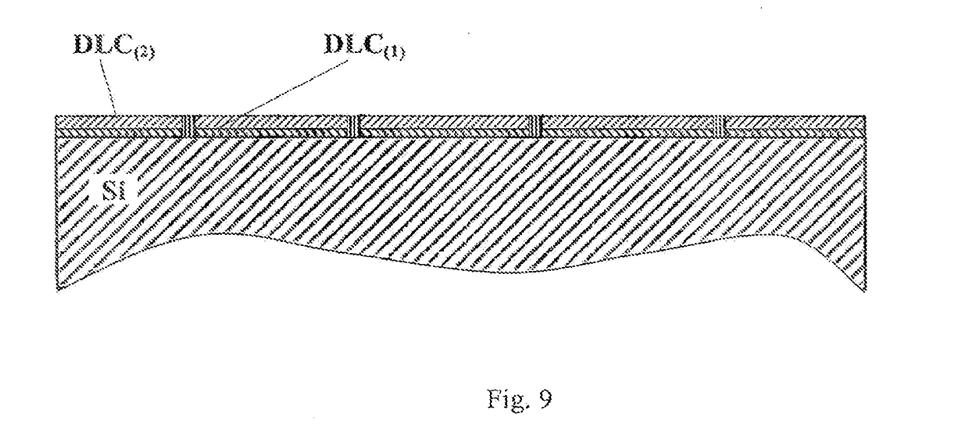
FIG. 9 shows a cross section of a photovoltaic cell with contact grid and bi-layer DLC film encapsulant.
Figure 10:
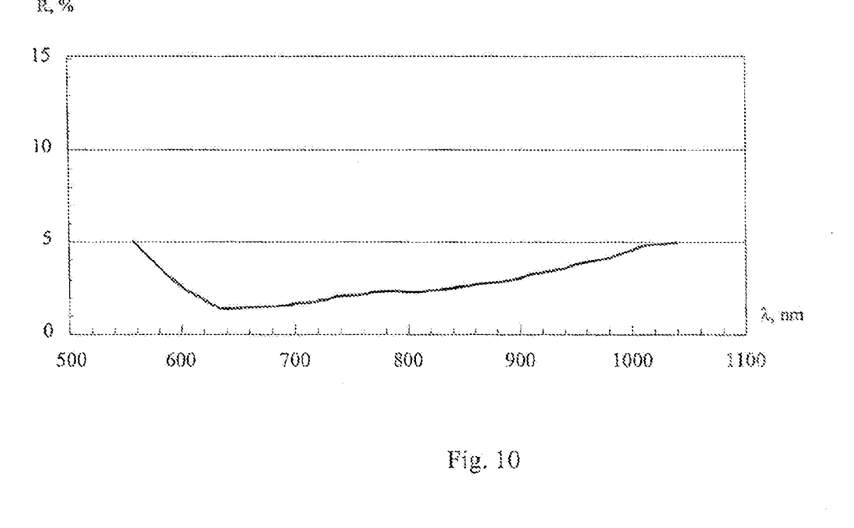
FIG. 10 shows reflectance spectrum of a bi-layer DLC film sample on c-Si substrate with film parameters of $n_1=2.4$, $d_1=60$ nm, and $n_2=1.6$, and $d_2=80$ nm.

As an example, FIG. 9 shows a cross section of a PV cell with a contact grid and bi-layer DLC film encapsulant ($DLC_{(1)}$:$n_1$=2.4, $d_1$=60 nm; $DLC_{(2)}$:$n_2$=1.6, $d_2$=80 nm). FIG. 10 shows the reflection spectrum of the bi-layer DLC structure; the low reflectance (R≦5%) grants good antireflection effects of this PV cell encapsulation.

Figure 11:
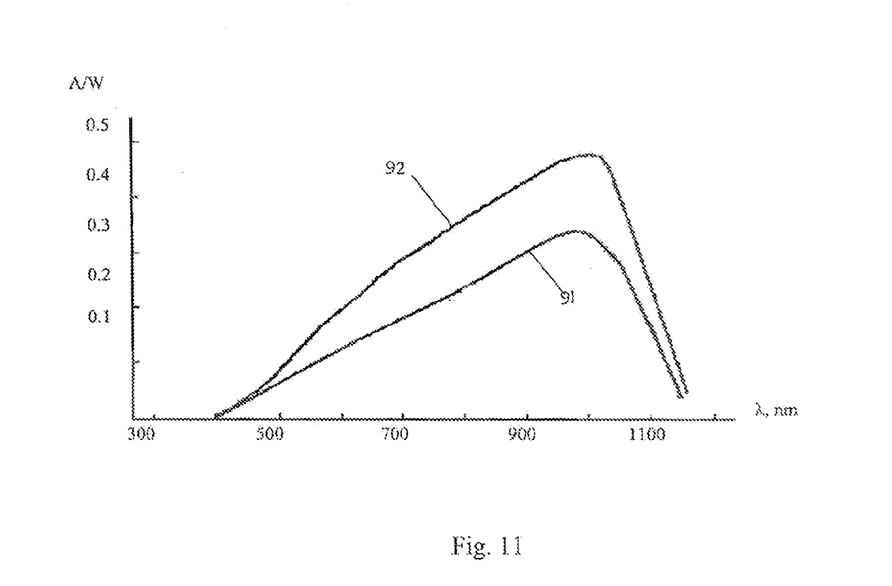
FIG. 11 shows a spectral response of a silicon photovoltaic cell (excited from the back).

FIG. 11 shows a spectral response of a Si PV cell (excited from the back): curve 91—before DLC coating, curve 92 after DLC coating. The cell efficiency enhancement is stronger than that can be explained by the antireflecting effect. Significant performance improvement is attributed to reduced (surface) boundary recombination losses.

Weathering and chemical stability tests were performed on DLC encapsulated PV cells. In the course of weathering stability tests, silicon PV cells were kept in a special enclosure (or chamber) at 80-90° C. and relative humidity 90% for 20 hours. Optical and mechanical parameters of DLC films as well as efficiency of DLC coated PV cells were measured before and after the exposure to humid atmosphere. Practically no changes of these parameters were found (the data for PV cells efficiency are presented in Table 2).

In the course of chemical stability tests the DLC coated silicon PV cells were exposed to one of the following agents:
concentrated HNO$_3$ acid, 30 minutes, 25° C.
diluted (1%) HNO$_3$ acid, 1 hour, 25° C.
concentrated H$_2$SO$_4$ acid, 30 minutes, 25° C.
diluted (1%) H$_2$SO$_4$ acid, 1 hour, 25° C.
saturated solution of NaCl (sea fog simulation), 40 hours, 25-30° C.

Similar to weathering stability tests, measurements of reflectivity of DLC coating and PV cell efficiency as well as microscopic inspection of DLC coating surface were performed before and after the exposures. Again no effects of these exposures on the mentioned parameters were found (Table 2). These results demonstrate good chemical stability of DLC coating and are in striking contrast to the data of similar tests performed on ZnS coated silicon PV cells. In the latter case, the ZnS coating was damaged or destroyed and PV cells efficiency decreased by 30%.

A longer-term stability study was conducted for the DLC-coated Si samples in a stringent damp heat test (85° C./85% RH), which is being used to qualify thin film modules by the PV industry, for 762 hours. Results from the reflectance measurements indicate that the DLC-on-Si thin films show negligible or no change. Additionally, both microhardness and reflectivity did not change after heating at 350° C. for 2 hours, a slight change in reflectivity but not in microhardness was observed if heated at 380° C. for 2 hours. Intense oxidative degradation of the films was observed however, when heated to 410° C. or higher for less than 1 hour.

TABLE 2

| | | | Efficiency, % | | |
|---|---|---|---|---|---|
| $<E_k>$/,eV | $C_7H_8$/% | d, nm | Si + DLC PV cell | Weathering test Si + DLC PV cell | Chemical stability test Si + DLC PV cell |
| 55 | 22 | 80 | 9.87 | 9.85 | 9.78 |
| 70 | 16 | 80 | 9.71 | 9.75 | 9.58 |
| 65 | 13 | 75 | 8.90 | 8.93 | 8.78 |
| 60 | 12 | 85 | 9.27 | 9.23 | 9.28 |
| 75 | 10 | 85 | 9.11 | 9.18 | 9.14 |
| 65 | 14 | 80 | 8.82 | 8.90 | 8.80 |

It was found that UV, proton and electron irradiation do not affect the properties of DLC films and DLC encapsulated PV cells. For UV irradiation tests, a high-pressure xenon lamp was used with the spectra similar to that of the sun but with higher intensity of UV. Silicon PV cells with various coatings (DLC, ZnS, SiO$_2$) were exposed to the light of the Xe lamp with a UV power density of ~0.5 W·cm$^{-2}$ for ~400 hours. No effects on the DLC coated PV cell efficiency were found. On the other hand, for a ZnS coated cell a ~15% decrease of efficiency was observed, possibly due to UV induced degradation of the film transparency and enhancement of the surface recombination rate at the Si—ZnS boundary.

Figure 12:
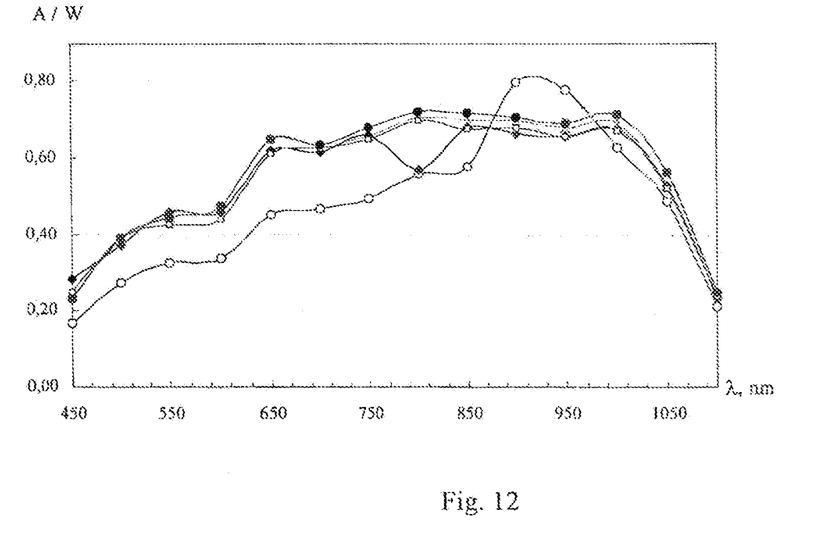
FIG. 12 shows the effect of proton irradiation on spectral efficiency of DLC coated photovoltaic cells.

Proton irradiation is an important factor causing degradation of PV cells used in space. The proton energy interval, which is of interest as far as the effects on the DLC films with technologically realistic thickness (~2 μm) are concerned, ranges from 10 keV to 500 keV. To choose the conditions of a proton irradiation test, data on the proton spectrum given by the accepted models (such as NASA AP-8 and JPL-91) were used. To simulate the effects of solar proton irradiation, the range of 10-500 keV was divided into two intervals: 10-50 keV and 50-500 keV. Integration of the proton spectrum given by AP-8 model within these intervals for 11 years period gives the fluences $2\times10^{12}$ and $5\times10^{11}$ $cm^{-2}$ respectively. To simulate the effect of proton irradiation with the energy in these intervals proton implantation with energies 20 and 150 keV and fluences $10^{14}$ $cm^{-2}$ and $10^{13}$ $cm^{-2}$ respectively was used, which allows for all possible errors in proton flux estimates and may correspond to at least 100 years exposure. The implantation was performed into a 1.5 μm DLC film deposited on a quartz substrate and into DLC coatings on two silicon PV cells. No effect of the implantation on the optical properties of DLC film was found. Similarly, the spectral efficiency of the cells was not affected by the implantation (FIG. 12). This means that DLC coating with the thickness ~2 μm is stable and can serve as a radiation shield against solar protons. Similar results were obtained with 1 MeV electron irradiation.

The foregoing description of the invention has been presented for purposes of illustration and description. It is not intended to be exhaustive or to limit the invention to the precise form or structure disclosed, and other modifications and variations may be possible in light of the above teachings and within the scope of the claims appended hereto. The embodiments described above were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art. The words "comprise," "comprising," "include," "including," and "includes" when used in this specification and in the following claims are intended to specify the presence of stated features, integers, components, or steps, but they do not preclude the presence or addition of one or more other features, integers, components, steps or groups thereof.

What is claimed is:

1. A method of depositing a diamond-like carbon film on a substrate, comprising:
   producing a plasma comprising $C^+$, $H^+$, $N^+$, $Ar^+$ ions with an electric field chamber with a magnetic field perpendicular to the electric field;
   slowing electrons and collimating a flow of the ions in the plasma with an annular, grounded diaphragm;
   emitting electrons into the plasma to neutralize slow ions and non-dissociated $C_xH_x$ radicals in the plasma with a neutralizer electrode; and
   controlling energy of the ions in the flow of the ions toward the substrate by passing the flow of ions through an accelerating electrode and a grid.

2. The method of claim 1, including applying 30-50V AC to the neutralizer electrode.

3. The method of claim 1, including biasing the accelerating electrode with voltage in a range of −50 to −400V.

4. The method of claim 1, including adjusting a biased voltage on the accelerating electrode to provide average ion energy at the substrate in a range of 20 to 150 eV.

5. The method of claim 1, including rotating the substrate in the flow of ions.

6. The method of claim 1, including rotating a plurality of substrates into and out of the flow of ions.

7. The method of claim 1, including producing the flow of ions in an area having a diameter of at least 12 cm with ion energy that does not vary more than 10% in said area.

8. The method of claim 1, including positioning the neutralizer electrode outside the magnetic field.

* * * * *